United States Patent
Li et al.

(10) Patent No.: US 7,358,103 B2
(45) Date of Patent: Apr. 15, 2008

(54) METHOD OF FABRICATING AN IMAGING DEVICE FOR COLLECTING PHOTONS

(75) Inventors: Jin Li, Boise, ID (US); Jiutao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 11/357,343

(22) Filed: Feb. 21, 2006

(65) Prior Publication Data

US 2006/0138495 A1 Jun. 29, 2006

Related U.S. Application Data

(62) Division of application No. 10/864,387, filed on Jun. 10, 2004.

(51) Int. Cl.
*H01L 21/00* (2006.01)
(52) U.S. Cl. .................... 438/29; 257/E21.548
(58) Field of Classification Search .............. 438/23, 438/24, 29; 359/627, 636
See application file for complete search history.

(56) References Cited

U.S. PATENT DOCUMENTS

| | | | |
|---|---|---|---|
| 4,875,082 A | 10/1989 | Bredthauer | |
| 4,876,586 A | 10/1989 | Dyck et al. | |
| 5,120,960 A | 6/1992 | Halvis | |
| 5,352,886 A * | 10/1994 | Kane | 250/216 |
| 5,471,515 A | 11/1995 | Fossum et al. | |
| 5,604,607 A * | 2/1997 | Mirzaoff | 358/484 |
| 5,640,013 A | 6/1997 | Ishikawa et al. | |
| 5,708,263 A | 1/1998 | Wong | |
| 5,885,425 A | 3/1999 | Hsieh et al. | |
| 5,910,940 A | 6/1999 | Guerra | |
| 5,952,645 A * | 9/1999 | Wang et al. | 250/208.1 |
| 6,157,017 A | 12/2000 | Kim | |
| 6,259,083 B1 | 7/2001 | Kimura | |
| 6,271,900 B1 | 8/2001 | Li | |
| 6,285,400 B1 | 9/2001 | Hokari | |
| 6,429,470 B1 | 8/2002 | Rhodes | |
| 6,465,786 B1 | 10/2002 | Rhodes | |
| 6,482,669 B1 | 11/2002 | Fan et al. | |
| 6,500,692 B1 | 12/2002 | Rhodes | |

(Continued)

FOREIGN PATENT DOCUMENTS

JP 10154805 6/1998

(Continued)

OTHER PUBLICATIONS

Reed, et al., "Fabrication of microchannels using polycarbonates as sacrificial materials," J. Micromech. Microeng. 11:733-737 (2001).

(Continued)

*Primary Examiner*—W. David Coleman
(74) *Attorney, Agent, or Firm*—Dickstein & Shapiro LLP (57) ABSTRACT

A photon collector has a reflecting metal layer to increase photon collection efficiency in a solid state imaging sensor. The reflecting metal layer reflects incident light internally to a photosensor. A plurality of photon collectors is formed in a wafer substrate over an array of photosensors. The photon collector is formed in an opening in an insulating layer provided over each photosensor.

15 Claims, 5 Drawing Sheets

U.S. PATENT DOCUMENTS

| | | |
|---|---|---|
| 6,507,083 B1 | 1/2003 | Tian |
| 2001/0004118 A1 | 6/2001 | Tsang |
| 2002/0122209 A1 | 9/2002 | Yoshida |
| 2003/0081895 A1 | 5/2003 | Roy et al. |
| 2003/0089842 A1 | 5/2003 | Moon et al. |
| 2003/0136759 A1 | 7/2003 | Mikolas |
| 2004/0082094 A1 | 4/2004 | Yamamoto |
| 2005/0274993 A1 | 12/2005 | Jiang et al. |

FOREIGN PATENT DOCUMENTS

| | | |
|---|---|---|
| JP | 2000124438 | 4/2000 |
| JP | 2000340783 | 12/2000 |
| JP | 2001044401 | 2/2001 |
| JP | 2002118245 A | 4/2002 |
| JP | 2002246579 | 8/2002 |
| JP | 2003197886 A | 7/2003 |

OTHER PUBLICATIONS

Bhusari et al., "Fabrication of Air-Channel Structures for Microfluidic, Microelectromechanical, and Microelectronic Applications," J. Microelectr. Systems 10(3): 400-408, (2001).

Nixon, et al., "256×256 CMOS Active Pixel Sensor Camera-on-a-Chip," Paper FA 11.1, Digest, IEEE, International Solid-State Circuits Conference, 1996, pp. 178, 179, 440 (3 pages).

* cited by examiner

METHOD OF FABRICATING AN IMAGING DEVICE FOR COLLECTING PHOTONS

This application is a divisional of application Ser. No. 10/864,387, filed Jun. 10, 2004, the disclosure of which is incorporated in its entirety by reference herein.

FIELD OF THE INVENTION

The present invention relates to solid state imaging sensors, and more particularly to metal coated photon collectors used in solid state imaging sensors.

BACKGROUND OF THE INVENTION

Solid state imagers generate electrical signals in response to light reflected by an object being imaged. Complementary metal oxide semiconductor (CMOS) imaging sensors are one of several different known types of semiconductor-based imagers, which include for example, charge coupled devices (CCDs), photodiode arrays, charge injection devices and hybrid focal plane arrays.

Some inherent limitations in CCD technology have promoted an increasing interest in CMOS imagers for possible use as low cost imaging devices. A fully compatible CMOS sensor technology enabling a higher level of integration of an image array with associated processing circuits would be beneficial to many digital image capture applications. CMOS imagers have a number of desirable features, including for example low voltage operation and low power consumption. CMOS imagers are also compatible with integrated on-chip electronics (control logic and timing, image processing, and signal conditioning such as A/D conversion). CMOS imagers allow random access to the image data, and have lower manufacturing costs, as compared with conventional CCDs, since standard CMOS processing techniques can be used to fabricate CMOS imagers. Additionally, CMOS imagers have low power consumption because only one row of pixels needs to be active at any time during readout and there is no charge transfer (and associated switching) from pixel to pixel during image acquisition. On-chip integration of electronics is particularly desirable because of the potential to perform many signal conditioning functions in the digital domain (versus analog signal processing) as well as to achieve reductions in system size and cost.

Nevertheless, demands for enhanced resolution of CCD, CMOS and other solid state imaging devices, and a higher level of integration of image arrays with associated processing circuitry, are accompanied by a need to improve the light sensing characteristics of the pixels of the imaging arrays. For example, it would be beneficial to minimize if not eliminate the loss of light transmitted to individual pixels during image acquisition and the amount of crosstalk between pixels caused by light being scattered or shifted from one pixel to a neighboring pixel.

Accordingly, there is a need and desire for an improved solid state imaging device, capable of receiving and propagating light with minimal loss of light transmission to a photosensor. There is also a need and desire for improved fabrication methods for imaging devices that provide a high level of light transmission to the photosensor and reduce the light scattering drawbacks of the prior art, such as crosstalk.

SUMMARY OF THE INVENTION

Exemplary embodiments of the invention include an imaging device, an image pixel array in an imaging device, and an imager system having improved characteristics for reception and transmission of light by photosensors. Enhanced reception of light is achieved by fabricating photon collectors having highly reflecting internal surfaces. The photon collectors of the invention are formed as individual units operable to collect and reflect light to corresponding individual photosensors.

Also provided are methods for forming an imaging device, in accordance with exemplary embodiments of the invention, including forming photon collectors disposed over focal plane arrays of photosensors. The exemplary embodiments provide methods of fabricating an imaging device that include forming a plurality of photosensors on a wafer, disposing an insulating material over the photosensors, etching openings in the insulating material sufficient to allow light to reach the photosensors, and coating the inner sidewalls of the openings with a highly reflecting layer. Additional steps include filling the openings with an optically transparent material, such as spin-on glass, and providing an optically transparent etching layer to protect the photosensor. A color filter layer is also fabricated with an individual color filter over a respective photosensor and a microlens structure layer is fabricated over the color filter layer.

These and other features and advantages of the invention will be more apparent from the following detailed description that is provided in connection with the accompanying drawings illustrating exemplary embodiments of the invention.

DETAILED DESCRIPTION OF THE INVENTION

In the following detailed description, reference is made to various specific embodiments which exemplify the invention. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

Figure 1:
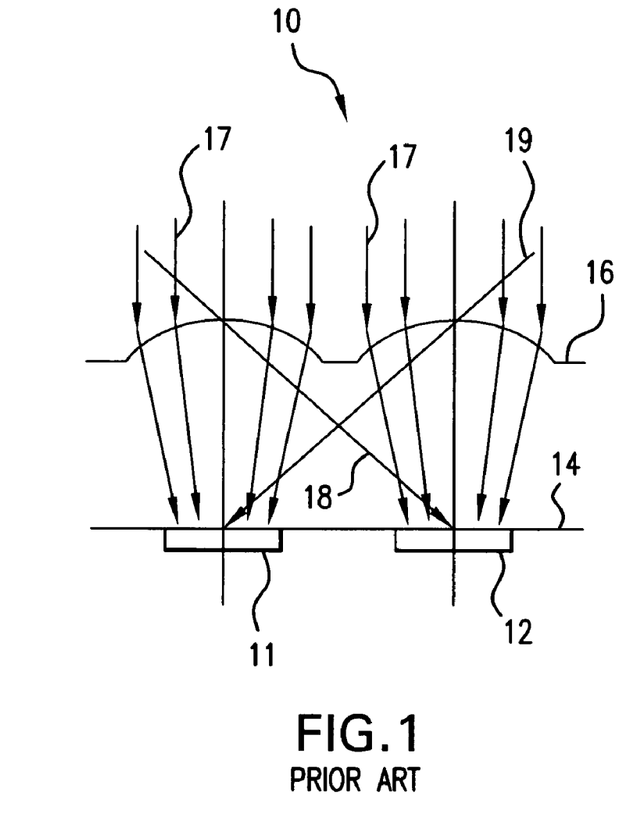
FIG. 1 is a diagram of a portion of a conventional imaging device illustrating light transmission paths.

Referring to the drawings, where like reference numbers designate like elements, the structure and function of an exemplary imager 20 according to the invention, shown in FIG. 2, will be described in relation to a prior art imager 10 depicted in FIG. 1. For the sake of simplicity, the invention will be described in the environment of a CMOS imager; however, it should be understood that the invention may be implemented with a CCD imager and other solid state imagers as well. In addition, exemplary embodiments of the invention are described as using photodiode photosensors; however, it should be understood that other photosensors may also be used.

The illustrated portion of the conventional imager 10 includes photodiodes 11 and 12 as the photosensors formed in a substrate 14, above which a lens structure 16 is supported. Incident light rays 17 are focused by lens structure 16 onto respective photodiodes 11, 12. Off-axis light rays 18, 19, for example, pass through the lens structure 16, however, and impinge respectively on neighboring pixel photodiodes 12 and 11, generating "crosstalk" such that light that should have been detected by one pixel is actually detected by another pixel.

Figure 2:
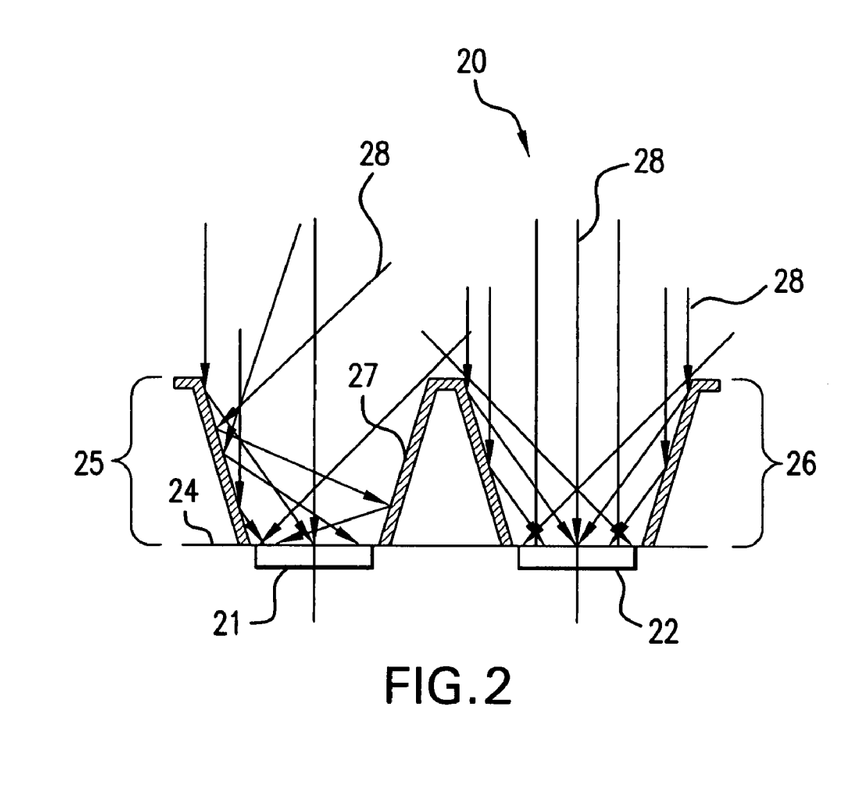
FIG. 2 is a diagram of a portion of an imaging device exemplifying an embodiment of the invention.

FIG. 2 illustrates a first embodiment of the invention in which a portion of the imager 20 has photodiodes 21 and 22 formed in substrate 24. Photon collectors 25, 26 provided above the photodiodes 21, 22 have sidewalls featuring interior reflecting layers 27. Incident light 28 impinges either directly on photodiodes 21, 22, or indirectly after being reflected internally by inner layers 27. Reflecting layers 27 are formed of a highly reflecting material, such as aluminum or silver, to provide substantially total reflection. Consequently, all, or nearly all, of the light entering the photon collectors 25, 26 is directed respectively to photodiodes 21, 22. Little, if any, of the off-axis light impinges on neighboring pixels. As a result, crosstalk is reduced, and photon collection efficiency is increased.

Figure 3:
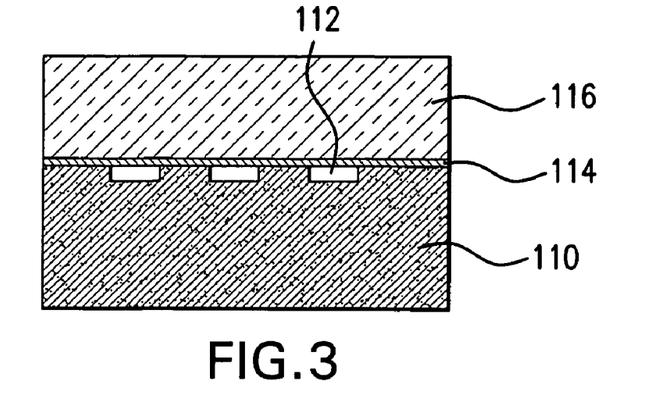
FIG. 3 depicts a cross-sectional view of a portion of an imaging device and the initial formation of a pixel array in accordance with one embodiment of the invention.

An exemplary method of fabricating a CMOS imaging device to include interior reflecting layers 27 is described with reference to FIGS. 3-8. FIG. 3 depicts a semiconductor substrate 110 on which a plurality of photosensors, e.g., photodiodes 112, has been fabricated. The substrate 110 includes integrated circuits and other semiconductor components incorporated conventionally in a CMOS chip device that have been omitted from the drawings for clarity. The photodiodes 112 are fabricated using conventional techniques and are shown to illustrate one environment of many in which the present invention may be employed.

An etch stop layer 114 is formed over the top of the photodiodes 112 prior to formation of an insulating layer 116 using processes and materials known in the art. Layer 116 may be formed of BPSG, TEOS, or other optically transparent materials and may be the insulator employed as an interlayer dielectric (ILD) between conductive traces of an imager array. Etch stop layer 114 is formed of an optically transparent etch stop material and remains in place over the photodiodes 112. Suitable optically transparent etch stop materials include silicon nitride ($Si_3N_4$), for example.

Photodiodes 112 are depicted in a symmetric arrangement and orientation, with an intervening space separating each respective photodiode 112 in substrate 110. The image pixel array of the invention is preferably formed with minimal space between each adjacent photodiode. It should be understood, however, that the invention is applicable to other photosensor arrangements and orientations, to be integrated compatibly with other components of the device.

Figure 4:
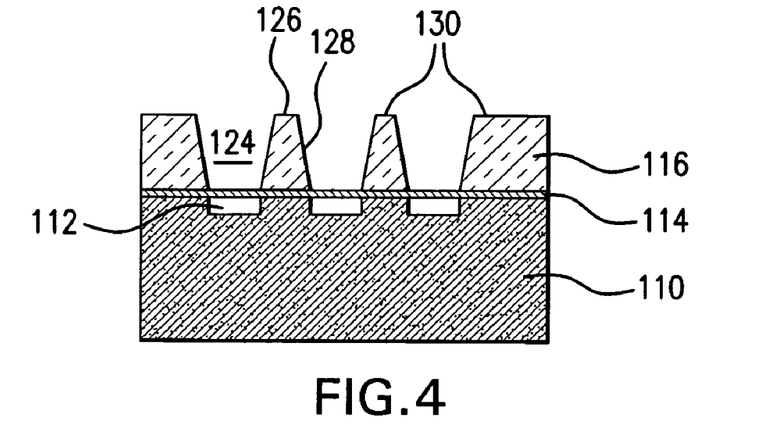
FIG. 4 depicts a cross-sectional view of the FIG. 3 device at the beginning of the formation of a photon collector in accordance with the invention.

As depicted in FIG. 4, openings 124 are formed in insulating layer 116 over each photodiode 112. The openings 124 are formed by etching down to etch stop layer 114 using processes known in the art. Alternatively, no etch stop layer 114 is provided, and etching is stopped prior to damaging the surface of the photodiode with the etching process, while achieving sufficient depth to provide a opening that, once reflectively coated, will prevent crosstalk between pixels. Although FIG. 4 depicts etched openings 124 as having substantially diagonal sidewall surfaces 128, it must be noted that the etched openings 124 are not limited in shape or dimensions to the depiction in the accompanying drawings, but instead can be formed to any shape and dimensions desired consistent with the light-reflecting properties described below. The etched openings 124 can, for example, have a cylindrical or conical shape, or can be formed of combined concave and cylindrical shapes, as described below with reference to FIG. 9. In addition, the sidewalls 128 can have concave or convex-curved surfaces. The openings typically will feature upper portions having a larger diameter than at the base of the openings, and shoulders 130 formed between each opening.

Figure 5:
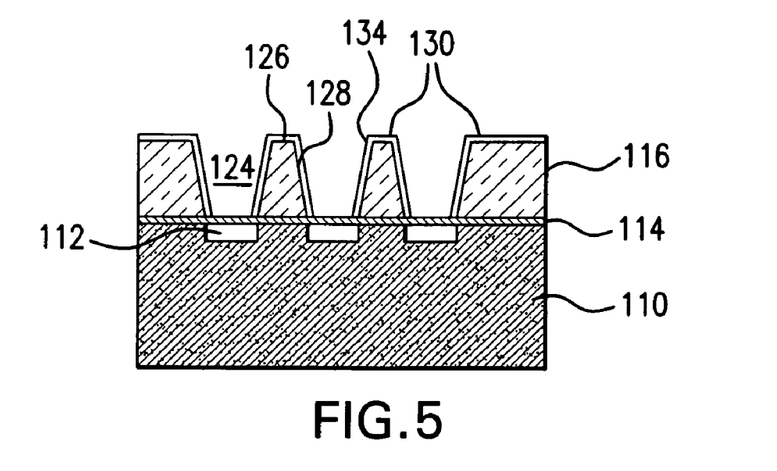
FIG. 5 depicts a cross-sectional view of the FIG. 3 device formed at a stage of processing subsequent to that shown in FIG. 4.

FIG. 5 illustrates a reflecting layer 134 formed on sidewalls 128 and shoulders 130 in accordance with one aspect of the invention. After etched openings 124 are formed, as depicted in FIG. 4, optically reflecting material is deposited within each opening 124 to form reflecting layer 134 on sidewalls 128 and shoulders 130. Depositing the reflecting material on the shoulders 130 also blocks light from going through the shoulders, and thus further limits crosstalk. The reflecting layer 134 may include any material that is optically reflecting, preferably about 100% optically reflecting. Exemplary materials include metallic silver (Ag) and aluminum (Al). Ag is less preferred as compared to Al because a barrier layer is required beneath the Ag layer to prevent Ag ion diffusion into insulating layer 116. Suitable barrier layer materials for use with an Ag layer are known in the art and include titanium nitride (TiN) and titanium tungsten (TiW).

Figure 6:
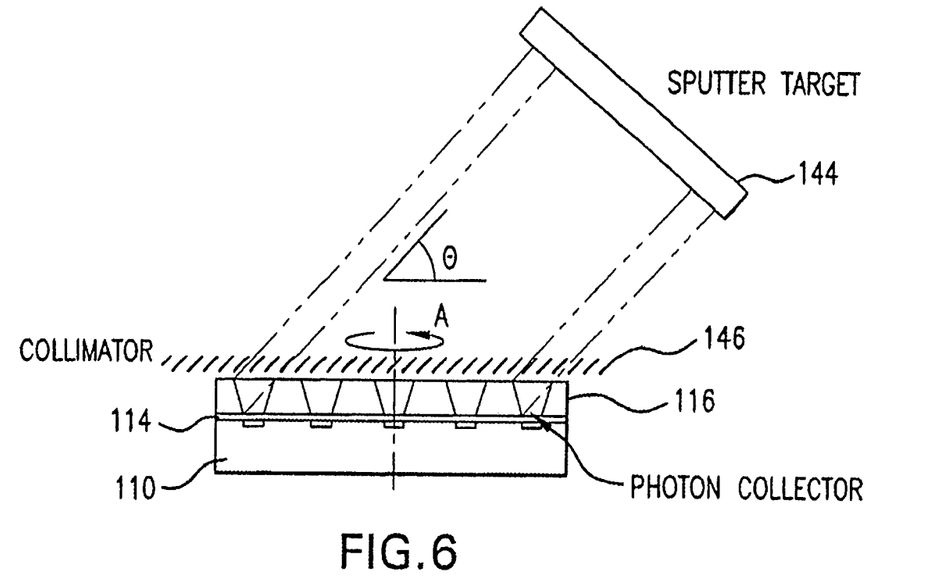
FIG. 6 depicts a diagram of a fabrication step at a stage of processing shown in FIG. 5.

FIG. 6 is a schematic diagram of an exemplary apparatus and method for depositing reflecting layer 134 on sidewalls 128 and shoulders 130 of ILD layer 116 using collimated angle sputter deposition. Reflecting layer 134 is deposited using a sputter target 144 directed at an off-axis angle θ through a collimator 146. The angle θ is chosen to prevent deposition of reflecting material on etch stop layer 114 over photodiodes 112. The substrate 110 is rotated during deposition (indicated by arrow A) to achieve better uniformity in the deposited layer 134. The layer 134 is deposited to a thickness sufficient to provide total or substantially total reflection. A thickness of 1000 Å is typically enough to do this and prevent visible light transmission through layer 134.

Figure 7:
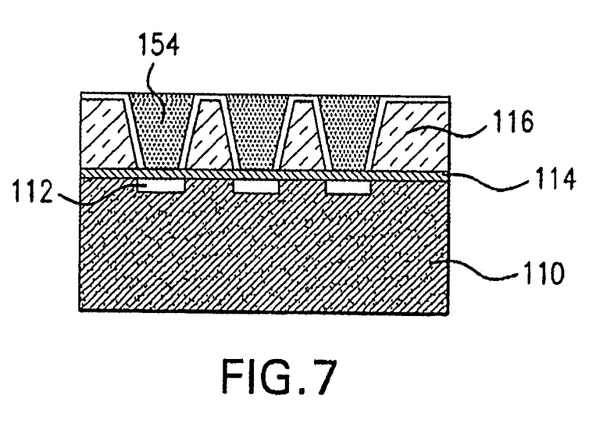
FIG. 7 depicts a cross-sectional view of the FIG. 3 device formed at a stage of processing subsequent to that shown in FIG. 5.

Referring to FIG. 7, an optically transparent layer 154 is provided in the openings 124 over reflecting layer 134. In an exemplary embodiment, layer 154 is a spin-on dielectric (SOD), which forms a smooth upper surface and requires no chemical mechanical polishing (CMP). Alternatively, layer 154 can be an optically-transparent flowable oxide or photoresist. Examples include pure silica SODs such as Spinfil™ 400 series, and most preferably Spinfil™ 450, and photoresists such as MFR-401LL, available from JSR Corporation. Other transparent materials can also be used, with CMP if needed.

Figure 8:
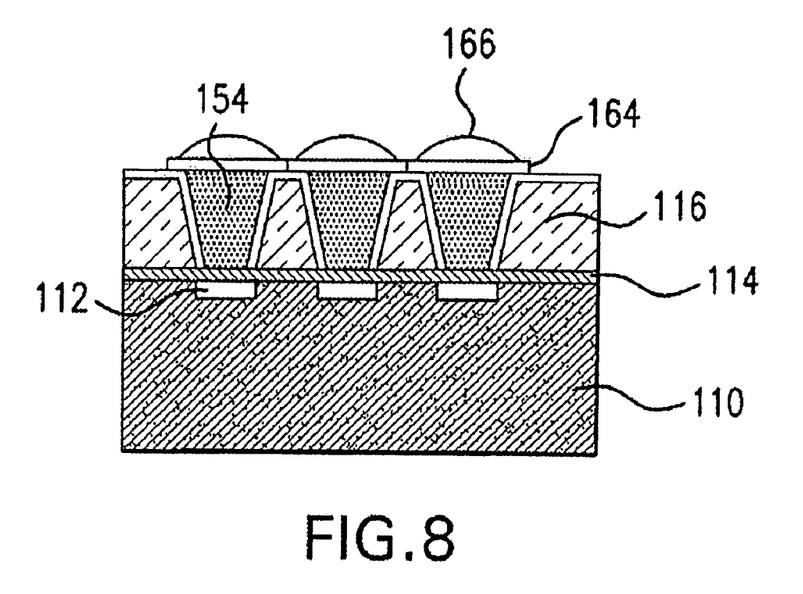
FIG. 8 depicts a cross-sectional view of the FIG. 5 device formed at a final stage of processing.

As illustrated in FIG. 8, a color resist layer or color filter array (CFA) 164, containing different color filters, is formed over each photodiode 112, schematically represented as being directly applied to transparent filler 154 and insulating layer 116. Resist layer 164 is provided such that a single color filter is formed over each photodiode 112. Various filtering schemes are known in the art, including additive arrangements of red, green, and blue (RGB) filters, and subtractive arrangements of cyan, magenta and yellow (CMY). In an RGB filter system, for example, since white light includes red, green, and blue light, an exemplary color resist layer 164 includes red, green, and blue filters positioned over respective photodiodes 112. Any combination or array of color filters, including RGB filters arranged in a so-called Bayer pattern, can be formed for color processing and imaging by an imaging device formed in accordance with the present invention.

An optional lens structure 166 is disposed above the filter resist 164 and serves to focus light toward the photodiodes 112. Other layers can be provided. For example, a separate nitride liner (not shown) can also be formed along the upper surfaces 126 of each opening 124 to guard against diffusion of impurities into the wafer or substrate 110 from the color filter materials comprising the color resist layer 164.

Figure 9:
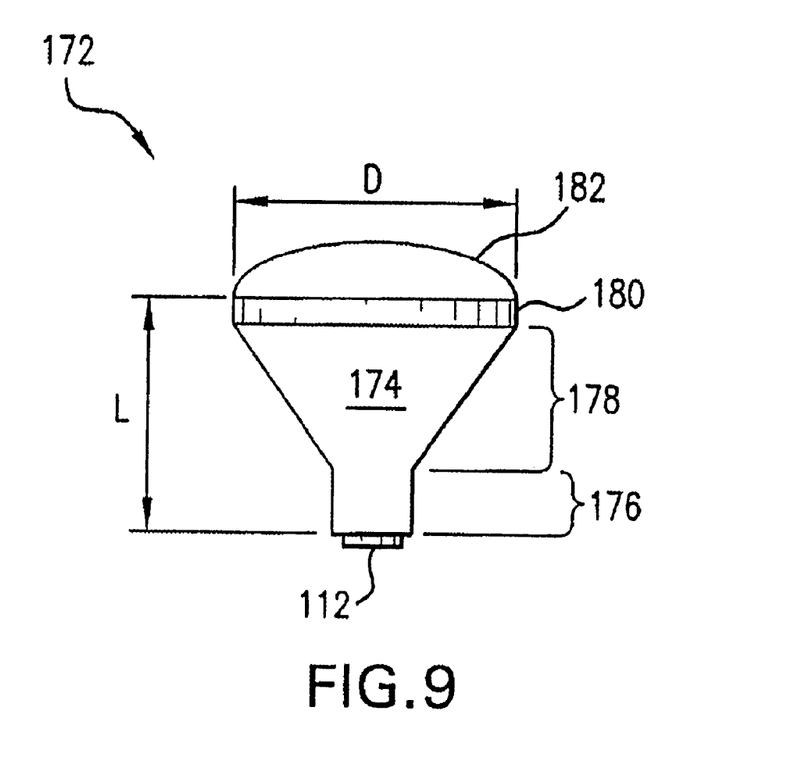
FIG. 9 depicts a schematic cross-sectional view of an alternative photon collector structure of the invention.

FIG. 9 is a schematic diagram of a photon collector 172 according to another embodiment of the invention, in which a compound opening 174 is formed over photodiode 112 and serves as a photon collection device. Opening 174 has both a cylindrical portion 176 and a straight conical portion 178. The sidewalls of conical opening 174 are lined with a material such as Al or Ag providing substantial or complete total reflection and the opening is filled with an SOD, for example. Other configurations are possible based on design constraints and intended application. Over the opening 174 are a CFA and spin-on glass/resist layer 180, and a lens structure 182.

One particular advantage of the invention is that it provides the ability to reduce the size of the imager pixel structure. An imager pixel structure can be described according to the following equation which relates to the diffraction limited spot radius of the focused light directed to the photodiode:

$$R = \frac{1.22 \cdot \lambda \cdot L}{n \cdot D}$$

In the equation, R is the diffraction limited spot radius, which defines the point at which light will be focused on the photodiode. $\lambda$ is wavelength, L is the imager stack thickness (FIG. 9), n is the index of refraction, and D is the micro-lens aperture (FIG. 9). The values for $\lambda$ and n typically are fixed for any given imager. The general industry trend is for D to get continually smaller as pixel sizes become further miniaturized. As pixel sizes get smaller, R must reduce concomitantly. The only remaining variable available to reduce the diffraction limited spot size R is the thickness L.

According to the invention, the size of the pixel can be reduced significantly because light can be focused higher in the photon collector, above the photodiode, effectively reducing the L (thickness) term in the spot radius equation above, as compared to the prior art structure having no photon collector. Consequently, the spot diameter, and thus the pixel size, can be reduced.

The concern in the prior art was to focus most of the light entering the photon collector to impinge directly on the photodiode, thereby reducing crosstalk between pixels. The photon collector of the present invention eliminates that concern, and allows the light to be focused higher, above the photodiode. In the prior art, focusing the light above the photodiode would have directed light to adjacent pixels, resulting in crosstalk. Due to the total reflection of the photon collector optics of the invention, however, light focused higher, closer to the lens 182 at the top of the opening 174 in FIG. 9, for example, will nevertheless impinge on the intended photodiode due to reflection or diffraction, and will not scatter or be shifted to neighboring photodiodes. Consequently, the effective L (thickness) term in the spot size equation above can be reduced significantly because the light can be focused at the top of the hole, closer to the lens. For example, current CMOS imagers having a thickness L equal to or about 5.0 μm can be reduced to have an effective thickness to about 1.1 μm, or substantially the thickness of the CFA and spin-on glass/resist layer 180 of FIG. 9.

Figure 10:
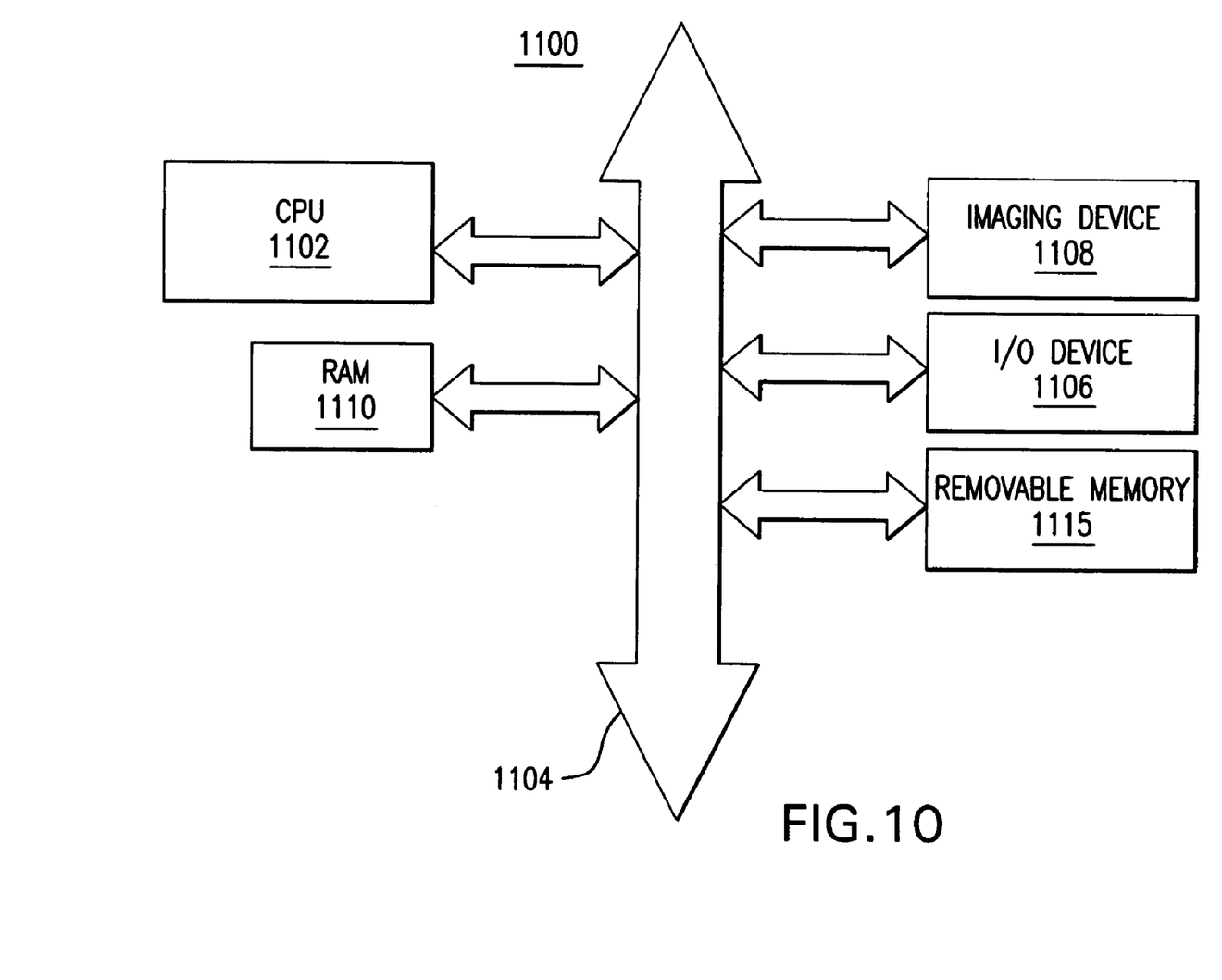
FIG. 10 illustrates a diagram of a processor-based system incorporating an imaging device fabricated according to the present invention, and wherein the imaging device contains one or more pixel arrays formed in accordance with the present invention.

FIG. 10 illustrates a processor-based system 1100 including an imaging device 1108. The imaging device 1108 includes an imager having a photosensor array, with the photocollection structures as described in connection with FIGS. 2-9. The processor-based system 1100 is exemplary of a system having digital circuits that could include image sensor devices according to the invention. Without being limiting, such a system could include a computer system, camera system, scanner, machine vision, vehicle imaging and navigation, video phone, surveillance system, auto focus system, and other systems and devices.

The processor-based system 1100, for example a camera system, generally comprises a central processing unit (CPU) 1102, such as a microprocessor, that communicates with an input/output (I/O) device 1106 over a bus 1104. Imaging device 1108 also communicates with the CPU 1102 over the bus 1104, and includes an imager including photon collectors according to the invention and associated image forming circuits, such as array processing circuits which produce an image signal. The processor-based system 1100 also includes random access memory (RAM) 1110, and can include removable memory 1115, such as flash memory, which also communicates with CPU 1102 over the bus 1104. Imaging device 1108 may include an image processor, such as a CPU, digital signal processor, or microprocessor, with associated memory storage on a single integrated circuit or with an image processor on a different chip from that contacting the image array.

While the invention is preferably directed to methods for forming photon collectors for use in CMOS imaging arrays and devices, and the resulting structures, one skilled in the art will recognize that the invention can be used to form any type of photon collector array for integration with one or more processing components in a semiconductor device.

The present invention offers an imager structure with high light collecting efficiency that can be mass-produced at a reasonable cost. The instant methods produce a CMOS imager having minimal crosstalk. Since a lens structure can be eliminated, the present invention obviates concerns about lens radius limitations and about damaging lenses during die attach, backgrind, and mounting processes.

It should again be noted that although the invention has been described with specific reference to CMOS imaging devices comprising a structure for transmitting light to a photodiode, the invention has broader applicability and may be used in any semiconductor imaging apparatus. Similarly, the fabrication process described above is but one method of many that may be used. The above description and drawings illustrate exemplary embodiments which achieve the objects, features and advantages of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Latters Patent of the United States is:

1. A method of fabricating an imaging device, said method comprising:
   forming a plurality of photosensors on a wafer;
   forming an insulating layer on the wafer over the plurality of photosensors;
   forming a respective opening in the insulating layer, above the plurality of photosensors; and
   depositing a reflecting material on sidewalls of each opening.

2. A method according to claim 1, wherein said the reflecting material is a metal.

3. A method according to claim 1, wherein the diameter of an upper portion of each opening is greater than the diameter at the base of each opening.

4. A method according to claim 1, wherein the sidewalls of each opening are selected from the group consisting of substantially perpendicular, substantially diagonal, curved surfaces, and combinations thereof.

5. A method according to claim 1, further comprising depositing the reflecting material through a collimated structure.

6. A method according to claim 1, further comprising providing an optically transparent material contained within the sidewalls of each opening.

7. A method according to claim 6, wherein the optically transparent material is selected from the group consisting of spun-on glass and photoresist.

8. A method according to claim 2, wherein the reflecting material is aluminum.

9. A method according to claim 2, wherein the reflecting material is silver.

10. A method according to claim 9, the method further including forming a barrier layer between the silver and the insulating layer.

11. A method according to claim 5, wherein the wafer is held at an angle relative to the collimated structure.

12. The method of claim 5, wherein the wafer is rotated relative to the collimated structure during deposition of the reflecting material.

13. A method according to claim 11, wherein the angle is selected such that the reflecting material is not deposited over the photosensors.

14. A method of fabricating an imaging device, said method comprising:
    forming a photodiode within a semiconductor substrate located beneath an insulating layer;
    providing an etch stop layer over said the photodiode;
    etching an opening in the insulating layer above the photodiode to the etch stop layer;
    depositing a light-reflecting metal on sidewalls of the opening; and
    filling the opening with an optically transparent material.

15. The method of claim 14, wherein the light-reflecting metal is deposited on the sidewalls of the opening using a collimated source of the light-reflecting metal.

* * * * *

UNITED STATES PATENT AND TRADEMARK OFFICE
CERTIFICATE OF CORRECTION

PATENT NO. : 7,358,103 B2
APPLICATION NO. : 11/357343
DATED : April 15, 2008
INVENTOR(S) : Li et al.

It is certified that error appears in the above-identified patent and that said Letters Patent is hereby corrected as shown below:

On the Title page, in field (74), in "Attorney, Agent, or Firm", in column 2, line 1, after "Dickstein" delete "&".

In column 7, line 38, in Claim 2, after "wherein" delete "said".

In column 8, line 33, in Claim 14, after "over" delete "said".

Signed and Sealed this

First Day of July, 2008

JON W. DUDAS
*Director of the United States Patent and Trademark Office*